(12) United States Patent
Lee

(10) Patent No.: US 7,875,949 B2
(45) Date of Patent: Jan. 25, 2011

(54) IMAGE SENSOR DEVICE WITH SUBMICRON STRUCTURE

(75) Inventor: Hsiao-Wen Lee, Hsinchu (TW)

(73) Assignee: VisEra Technologies Company Limited, Hsinchu Science Park (TW)

( * ) Notice: Subject to any disclaimer, the term of this patent is extended or adjusted under 35 U.S.C. 154(b) by 266 days.

(21) Appl. No.: 12/039,540

(22) Filed: Feb. 28, 2008

(65) Prior Publication Data

US 2009/0218650 A1 Sep. 3, 2009

(51) Int. Cl.
*H01L 31/075* (2006.01)
(52) U.S. Cl. .................. 257/458; 257/184; 257/257; 257/290; 257/E31.058
(58) Field of Classification Search .............. 257/184, 257/257, 291, 290, 458
See application file for complete search history.

(56) References Cited

U.S. PATENT DOCUMENTS

| 4,453,184 | A * | 6/1984 | Hamakawa et al. ......... 348/294 |
| 6,288,388 | B1 * | 9/2001 | Zhang et al. ............. 250/214.1 |
| 6,709,885 | B2 | 3/2004 | Uppal et al. |
| 2007/0279501 | A1 * | 12/2007 | Goto et al. .................. 348/272 |

* cited by examiner

*Primary Examiner*—Wai-Sing Louie
(74) *Attorney, Agent, or Firm*—Muncy, Geissler, Olds & Lowe, PLLC

(57) ABSTRACT

An image sensor device is disclosed. The image sensor device comprises a substrate having a pixel region and at least one integrated circuit in the substrate of the pixel region. A photodiode is disposed on the substrate of the pixel region, comprising a lower electrode, a transparent upper electrode and a photoelectric conversion layer. The lower electrode is disposed on the substrate and is electrically connected to the integrated circuit. The photoelectric conversion layer is disposed on the lower electrode and has a submicron structure therein. The transparent upper electrode is disposed on the photoelectric conversion layer.

15 Claims, 2 Drawing Sheets

# IMAGE SENSOR DEVICE WITH SUBMICRON STRUCTURE

BACKGROUND OF THE INVENTION

1. Field of the Invention

The invention relates to an optoelectronic device and more particularly to an image sensor device using a submicron structure.

2. Description of the Related Art

As optoelectronic devices become more and more popular, such as digital camera, digital video recorder, image capture capable mobile phone and monitor, demand for image sensor devices accordingly increase. An image sensor device is used to record and change a photo signal from an image to an electronic signal. After recording and processing the electronic signal, a digital image is generated. In general, image sensor devices can be categorized into two main types, one is charge coupled devices (CCD) and the other complementary metal oxide semiconductor (CMOS) devices.

In order to improve image sensor device performance, laterally integrated CMOS image sensor devices, which use CMOS circuitry in each pixel and photodiodes for light sensing devices, have been developed. The CMOS circuitry increases sensitivity and reduces noise, allowing pixel size to shrink while maintaining functionality. For a typical laterally integrated CMOS image sensor device, the photodiode and the CMOS circuitry are formed next to each other on a silicon substrate. Thus, fill factor is reduced, lowering the sensitivity of sensors. If pixel size increases to maintain sensitivity, resolution will be reduced.

U.S. Pat. No. 6,709,885 discloses an image sensor device fabricated by vertically integrating a photodiode above the CMOS control circuitry to increase fill factor. Accordingly, such an image sensor device can provide higher sensitivity with the same pixel size as the laterally integrated CMOS image sensor device.

However, as the pixel size is reduced in order to form more pixels to increase resolution, the fill factor is reduced and results in an increase in the dark current due to increased dead zones between pixels, thus aggravating image lag effect. The dead zone of the photodiode is a region where the transfer efficiency of optical charges is poor and dark current is generated due to thermal generation of charge carriers, thus no signal is generated at the dead zone when light enters the photodiode.

Therefore, there is a need to develop a novel image sensor device structure capable of alleviating image lag effect by reducing dark current in the image sensor device.

BRIEF SUMMARY OF THE INVENTION

A detailed description is given in the following embodiments with reference to the accompanying drawings. An image sensor device is provided. The image sensor device comprises a substrate having a pixel region and at least one integrated circuit in the substrate of the pixel region. A photodiode is disposed on the substrate of the pixel region, comprising a lower electrode, a transparent upper electrode and a photoelectric conversion layer. The lower electrode is disposed on the substrate and is electrically connected to the integrated circuit. The photoelectric conversion layer is disposed on the lower electrode and has a submicron structure. The transparent upper electrode is disposed on the photoelectric conversion layer.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The following description is of the best-contemplated mode of carrying out the invention. This description is provided for the purpose of illustrating the general principles of the invention and should not be taken in a limiting sense. The scope of the invention is best determined by reference to the appended claims.

Figure 1:
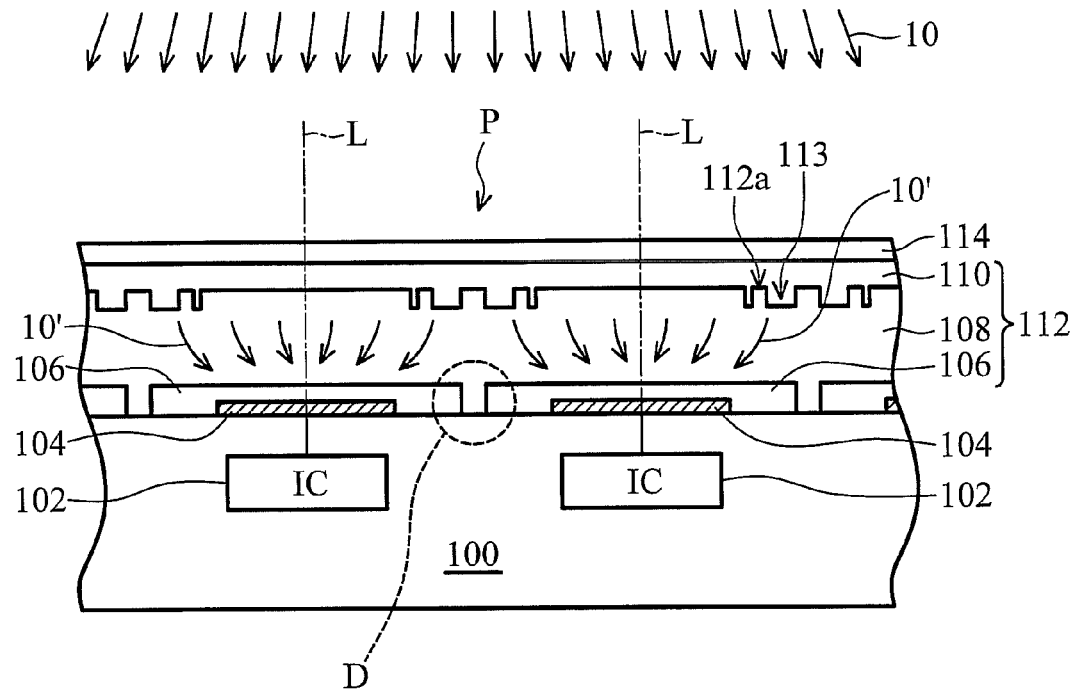
FIG. 1 is a cross section of an exemplary embodiment of an image sensor device according to the invention.

FIG. 1 illustrates an exemplary embodiment of an image sensor device according to the invention. The image sensor device comprises a substrate 100 and a plurality of photodiodes disposed thereon. The substrate 100 may comprise silicon or other well known semiconductor material in the art, having a pixel region P for arrangement of a pixel array (not shown) thereon. Each unit pixel in the pixel array includes a corresponding photodiode on the substrate 100 for converting a photo signal from an incident light 10 into an electronic signal. In the embodiment, a plurality of integrated circuits (ICs) 102 is disposed in the substrate 100 of the pixel region P and is electrically connected to the corresponding photodiodes. In order to simplify the diagram, only two photodiodes and two ICs 102 are depicted. Each IC 102 is used for controlling the corresponding unit pixel and may be a CCD or CMOS circuitry or an application specific integrated circuit (ASIC).

Each photodiode may comprise a lower electrode 104, a transparent upper electrode 110, and a photoelectric conversion layer 112 disposed therebetween. The lower electrode 104 is disposed on the substrate 100 and is electrically connected to the underlying IC 102 by, for example, via(s) (not shown). The lower electrode 104 may comprise metal, such as copper, aluminum, or alloys thereof, or other well known electrode materials in the art. In another embodiment, the lower electrode 104 comprise metal and may be covered by a metal barrier material comprising titanium or tantalum. The transparent upper electrode 110 disposed on the photoelectric conversion layer 112 may comprise a transparent conductive material, such as indium tin oxide (ITO) or indium zinc oxide (IZO).

The photoelectric conversion layer 112 disposed on the lower electrode 104 may comprise amorphous silicon, microcrystalline silicon, SiGe, CdTe, CdSe, CdS, copper indium diselenide (CIS), copper indium gallium diselenide (CIGS), or dye-sensitized $TiO_2$. Moreover, the photoelectric conversion layer 112 may be composed of a single layered or a multilayered structure. In the embodiment, the photoelectric conversion layer 112 is a multilayered structure composed of a first sub-layer 110 of a first conductivity type, a second sub-layer 108 made of an intrinsic semiconductor material, and a third sub-layer 106 of a second conductivity type opposite to the first conductivity type. For example, the first, second, and third sub-layers 110, 108, and 106 comprise of amorphous silicon and the first and second conductivity types are P type and N type, respectively.

As shown in FIG. 1, the first sub-layer 110 is adjacent to the upper transparent upper electrode 114, the second sub-layer 108 is disposed between the first sub-layer 110 and the lower electrode 104, and the third sub-layer 106 is disposed between the second sub-layer 108 and the lower electrode 104. Alternatively, the photoelectric conversion layer 112 may be composed of only two sub-layers, in which one is adjacent to the transparent upper electrode 114 and is N or P type. The other is adjacent to the lower electrode 104 and comprises an intrinsic semiconductor material.

Typically, the lower electrode 104 has a smaller size than that of the third sub-layer 106, such that a dead zone D is formed between the unit pixels and the edge portion of the third sub-layer 106. As fill factor is reduced due to reduction of pixel sizes, the dark current produced in the photodiode is increased due to the increase of the dead zone D between unit pixels. Thus, image lag effect is aggravated. In order to solve this problem, in particular, the photoelectric conversion layer 112 having a submicron structure 112a is used, such that an incident light 10 passing through the submicron structure 112a is resonated and the light beams 10' from the incident light 10 is bended toward the lower electrode 104. In the embodiment, the submicron structure 112a may comprise a plurality of submicron notches 113 arranged at an interface between the first and second sub-layers 110 and 108. Moreover, the submicron notches 113 may have different notch widths and different notch spacings. For example, one of the notches 113 near the central portion of the lower electrode 104 has a notch width W1 narrower than a notch width W2 of another one near the peripheral portion of the lower electrode 104. Moreover, the notch spacing S1 is narrower than the notch spacing S2. The plurality of submicron notches 113 can be symmetrically arranged at both sides of a dash line L through the central portion of the lower electrode 104 when the incident light 10 passes through the submicron structure 112a along a substantially vertical direction with respect to the surface of the lower electrode 104. The plurality of submicron notches 113 can be asymmetrically arranged at both sides of the dash line L when the incident light 10 passes through the submicron structure 112a along a tilted direction with respect to the surface of the lower electrode 104. Note that although four notches 113 is formed in one unit pixel, as shown in FIG. 1, the number of the notches 113 is based on the demand for the focal length and the shape of the focal point. Moreover, the number of the notches 113 may be increased as the unit pixel size or the photodiode size is increased. Additionally, although each notch 113 has a square shape, as shown in FIG. 1, the notch 113 may have a sine or triangular shape.

Note that incident light 10 is resonated, and carriers are generated on the top area of the second sub-layer 108 (or an intrinsic semiconductor layer). Moreover, the bended light beams 10' increase coupling efficiency to reduce dead zone D. Accordingly, the dark current produced in the photodiode can be reduced, thereby alleviating image lag effect.

Figure 2:
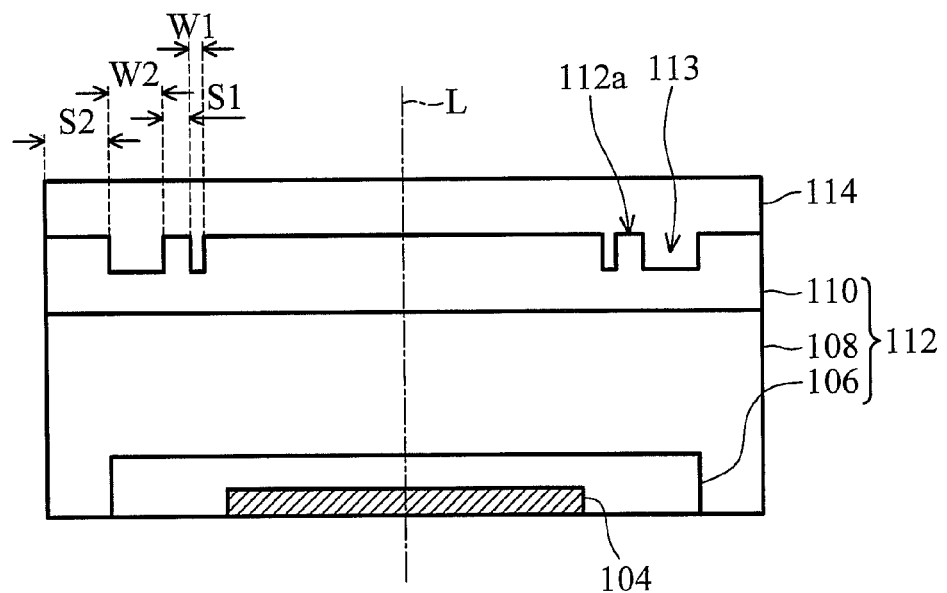
FIGS. 2 to 4 are cross sections of a variety of exemplary embodiments of a photodiode for an image sensor device according to the invention.
Figure 3:
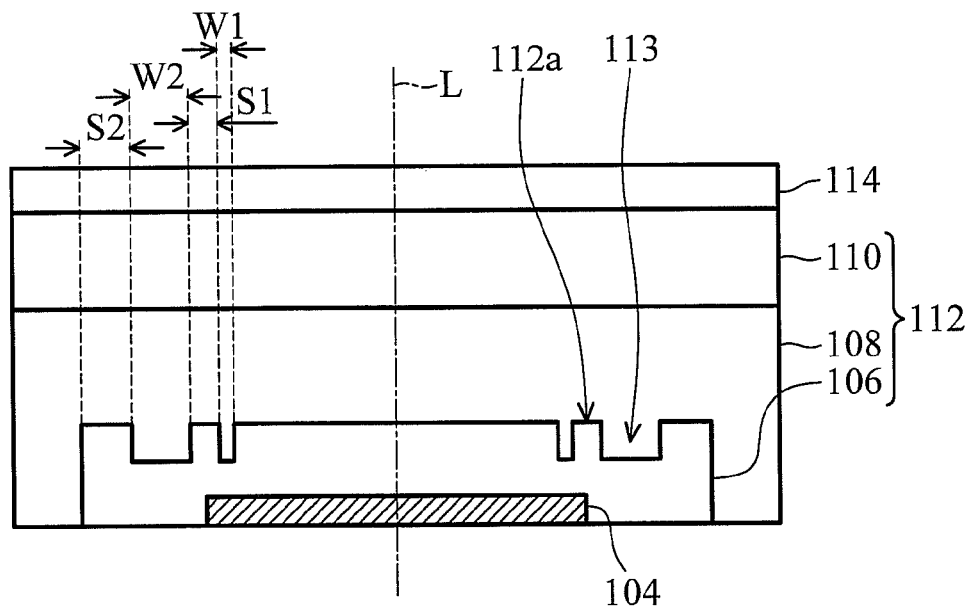
Figure 4:
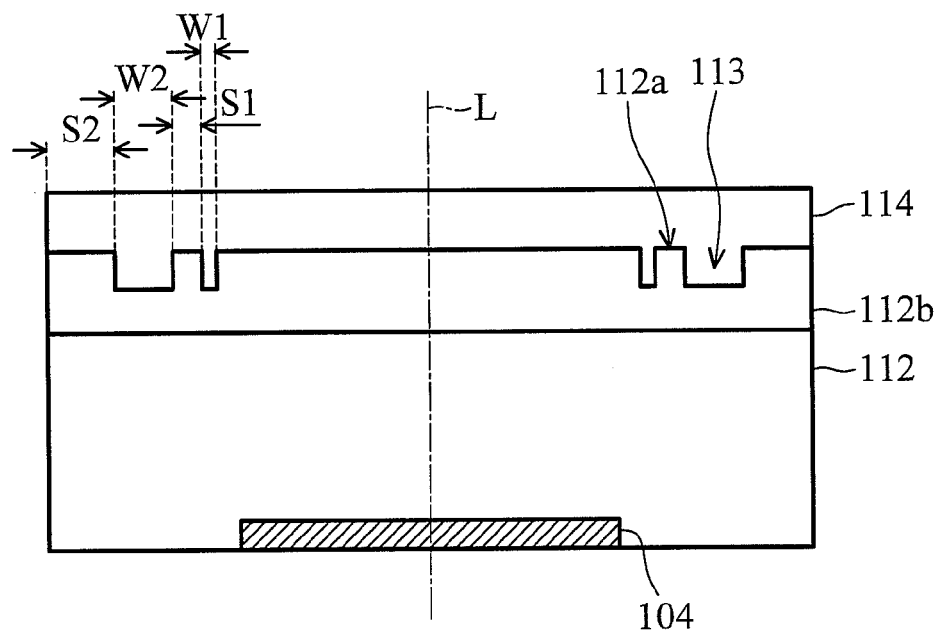

FIGS. 2 to 4 illustrate a variety of exemplary embodiments of a photodiode for an image sensor device according to the invention. The elements in FIGS. 2 to 4 that are the same as in FIG. 1 are labeled the same and not described further again for brevity. As shown in FIG. 2, the submicron structure 112 comprising a plurality of submicron notches 113 is arranged on a top surface of the first sub-layer 110. Moreover, as shown in FIG. 3, the submicron structure 112 comprising a plurality of submicron notches 113 is arranged at an interface between the second and third sub-layers 108 and 106. Additionally, as shown in FIG. 4, unlike the embodiments of FIGS. 1 to 3, the photoelectric conversion layer 112 is a single layer comprising an intrinsic semiconductor material having an N or P type doping region 112b therein. In the embodiment, the doping region 112b is formed on the upper portion of the photoelectric conversion layer 112 and contacts the transparent upper electrode 114. The submicron structure 112a of the photoelectric conversion layer 112 is arranged at an interface between the doping region 112b and the transparent upper electrode 114.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An image sensor device, comprising:
a substrate having a pixel region and at least one integrated circuit in the substrate of the pixel region; and
a photodiode disposed on the substrate of the pixel region, comprising,
a lower electrode with a substantially flat upper surface, disposed on the substrate, wherein the lower electrode is electrically connected to the integrated circuit,
a photoelectric conversion layer disposed on the lower electrode having a submicron structure therein, wherein the submicron structure comprises a plurality of submicron notches arranged away from a vertical projection of the lower electrode, and
a transparent upper electrode disposed on the photoelectric conversion layer.

2. The image sensor device as claimed in claim 1, wherein the photoelectric conversion layer comprises:
a first sub-layer having a first conductivity type adjacent to a transparent upper electrode; and
a second sub-layer made of an intrinsic semiconductor material disposed between the first sub-layer and a lower electrode.

3. The image sensor device as claimed in claim 2, wherein the photoelectric conversion layer further comprises a third sub-layer having a second conductivity type opposite to the first conductivity type disposed between the second sub-layer and the lower electrode.

4. The image sensor device as claimed in claim 3, wherein the plurality of submicron notches is arranged at an interface between the second and third sub-layers.

5. The image sensor device as claimed in claim 2, wherein the plurality of submicron notches is arranged on a top surface of the first sub-layer.

6. The image sensor device as claimed in claim 2, wherein the plurality of submicron notches is arranged at an interface between the first and second sub-layers.

7. The image sensor device as claimed in claim 1, wherein the plurality of submicron notches has different notch widths and different notch spacings.

8. The image sensor device as claimed in claim 1, wherein the number of the plurality of submicron notches is proportional to the photodiode size.

9. The image sensor device as claimed in claim 1, wherein the photoelectric conversion layer comprises an intrinsic semiconductor material having an N or P type doping region therein, contacting the transparent upper electrode.

10. The image sensor device as claimed in claim 9, wherein the plurality of submicron notches is arranged at an interface between the doping region and the transparent upper electrode.

11. The image sensor device as claimed in claim 1, wherein the plurality of submicron notches is symmetrically arranged at both sides of a line through the central portion of the lower electrode.

12. The image sensor device as claimed in claim 1, wherein the plurality of submicron notches is asymmetrically arranged at both sides of a line through the central portion of the lower electrode.

13. The image sensor device as claimed in claim 1, wherein the lower electrode comprises metal.

14. The image sensor device as claimed in claim 1, wherein the transparent upper electrode comprises ITO or IZO.

15. The image sensor device as claimed in claim 1, wherein the photoelectric conversion layer comprises amorphous silicon, microcrystalline silicon, SiGe, CdTe, CdSe, CdS, CIS, CIGS, or dye-sensitized $TiO_2$.

* * * * *